United States Patent
Lu et al.

(10) Patent No.: US 6,505,528 B2
(45) Date of Patent: Jan. 14, 2003

(54) DEVICE FOR FAST TAKING OUT AND PUTTING IN

(75) Inventors: Weng-Jung Lu, Hsinchu (TW);
Chin-Yuan Liu, Hsinchu (TW);
Yuan-Tsu Wan, HsinTien (TW);
Chun-Kuei Lai, Hsinchu (TW);
Chao-Hsien Huang, PanChiao (TW);
Chih-Min Lin, MiaoLi (TW);
Chun-Hsien Liu, Taipei (TW)

(73) Assignee: Industrial Technology Research Corp., Hsinchu (TW)

( * ) Notice: Subject to any disclaimer, the term of this patent is extended or adjusted under 35 U.S.C. 154(b) by 39 days.

(21) Appl. No.: 09/880,971

(22) Filed: Jun. 15, 2001

(65) Prior Publication Data

US 2002/0189380 A1 Dec. 19, 2002

(51) Int. Cl.⁷ ............................. B25J 11/00; B25J 18/00
(52) U.S. Cl. ..................... 74/490.01; 74/22 R; 74/47; 74/45
(58) Field of Search .................. 74/490.01, 490.03, 74/47, 45, 22 R, 22 A; 414/749.1; 901/25

(56) References Cited

U.S. PATENT DOCUMENTS

| | | | | |
|---|---|---|---|---|
| 622,827 A | * | 4/1899 | Smith | 74/45 |
| 4,186,619 A | * | 2/1980 | Nissen et al. | 74/22 R |
| 5,676,037 A | * | 10/1997 | Yoshizawa | 74/45 |
| 5,934,141 A | * | 8/1999 | Costa | 74/490.03 |

* cited by examiner

Primary Examiner—David A. Bucci
Assistant Examiner—Bradley J. Van Pelt
(74) Attorney, Agent, or Firm—Troxell Law Office PLLC

(57) ABSTRACT

The invention is a device for fast taking out and putting in, especially the device can fast take out a chip from a wafer to put in another chip receptacle, wherein, the invention includes a gear set, which consists of a first big gear, a second big gear and a small gear; at least two driving device, which consists a first driving device and a second driving device; a link mechanism, which cooperates with the gear set to proceed that the link mechanism moves forth toward a non-horizontal direction and back toward the reverse direction, and moves down toward a non-vertical direction and up toward the reverse direction as well; a lift mechanism, which is driven by the first driving device, and a mold plate with gear set and link mechanism is then driven either to complete the actions of moving down toward a non-vertical direction and up toward the reverse direction as mentioned above. The second driving device drives gear set, which utilizes the rotation of gear set to complete the actions of moving forth toward a non-horizontal direction and back toward the reverse direction as mentioned above.

9 Claims, 3 Drawing Sheets

DEVICE FOR FAST TAKING OUT AND PUTTING IN

FIELD OF THE INVENTION

This invention is about a device for fast taking out and putting in, especially applying the device on that fast taking a single chip out from a wafer and putting the chip in another chip receptacle.

BACKGROUND OF THE INVENTION

The structure to take out and put in for chip is complicate, thus the related technology involves wide range. For example, the application for prior art is the design of cam, spring, etc. On the other hand, electronic design, mechanical parts cooperation, software writing for action, space layout, procedure of service, etc. are related to each other very closely. Then this issue for structure design is a competition point of the same trade.

Because the structure in prior art is complicate, the action is the same as well. Thus the output for driving device should be more power and it is not avoided. The structure in prior art is a need to be redesigned. Another words, more power for output is proportional to cost, and it is the focus that being discussed here.

Generally, the production in prior art is 2000 to 3000 uph (unit per hour), and under the condition of urgently requiring in semiconductor market, the production has to be promoted for responding the present market requirement.

SUMMARY OF THE INVENTION

The main object of the invention is to offer a simplified structure, easy actions and promoted reliance device for fast taking out and putting in. The invention is a link mechanism to replace some actions controlled by software for simplifying design. On the other hand, the match of electronic portion and mechanical portion is decreased; the trouble possibility is down to promote the reliance of whole structure by way of simplified structure. Meantime, space layout and maintenance services are simplified as well.

The second object of the invention is to lower cost. The mechanical structure is cut down, the actions are also simplified relatively, and the power for output is decreased as well. Considering a long-term period, the saving cost is a large amount.

The third object of the invention is to increase production. The aforesaid production is between 2000 to 3000 uph, the invention is from 3500 to 5000 uph, and it is almost 50% promotion. The main factor is the link mechanism design, and the function for the special design is to cut down both structure and actions.

For further understanding the invention, following is the drawings and brief description.

DETAILED DESCRIPTION OF THE PREFERRED EMBODIMENT

Figure 1:
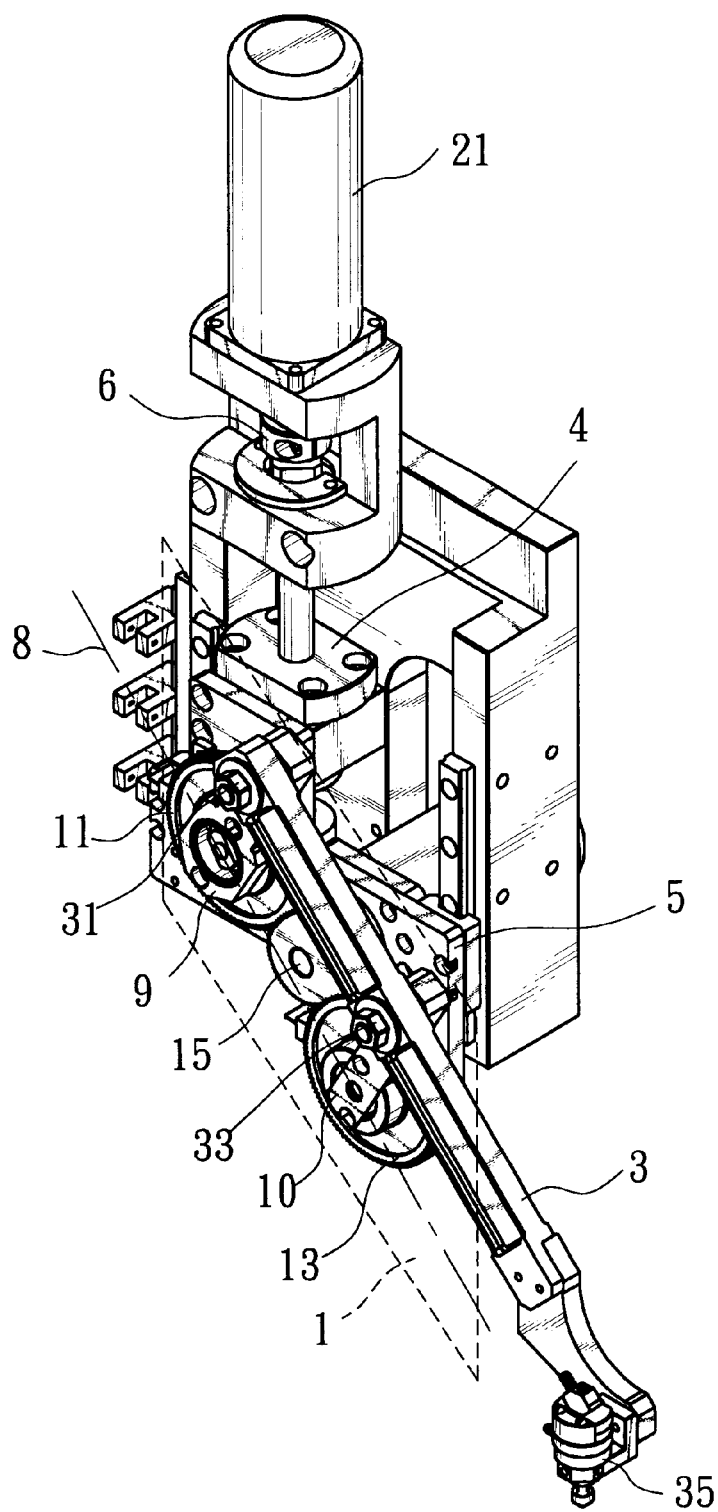
FIG. 1 is the 3-dimensional drawing of the preferred embodiment of the invention.
Figure 2:
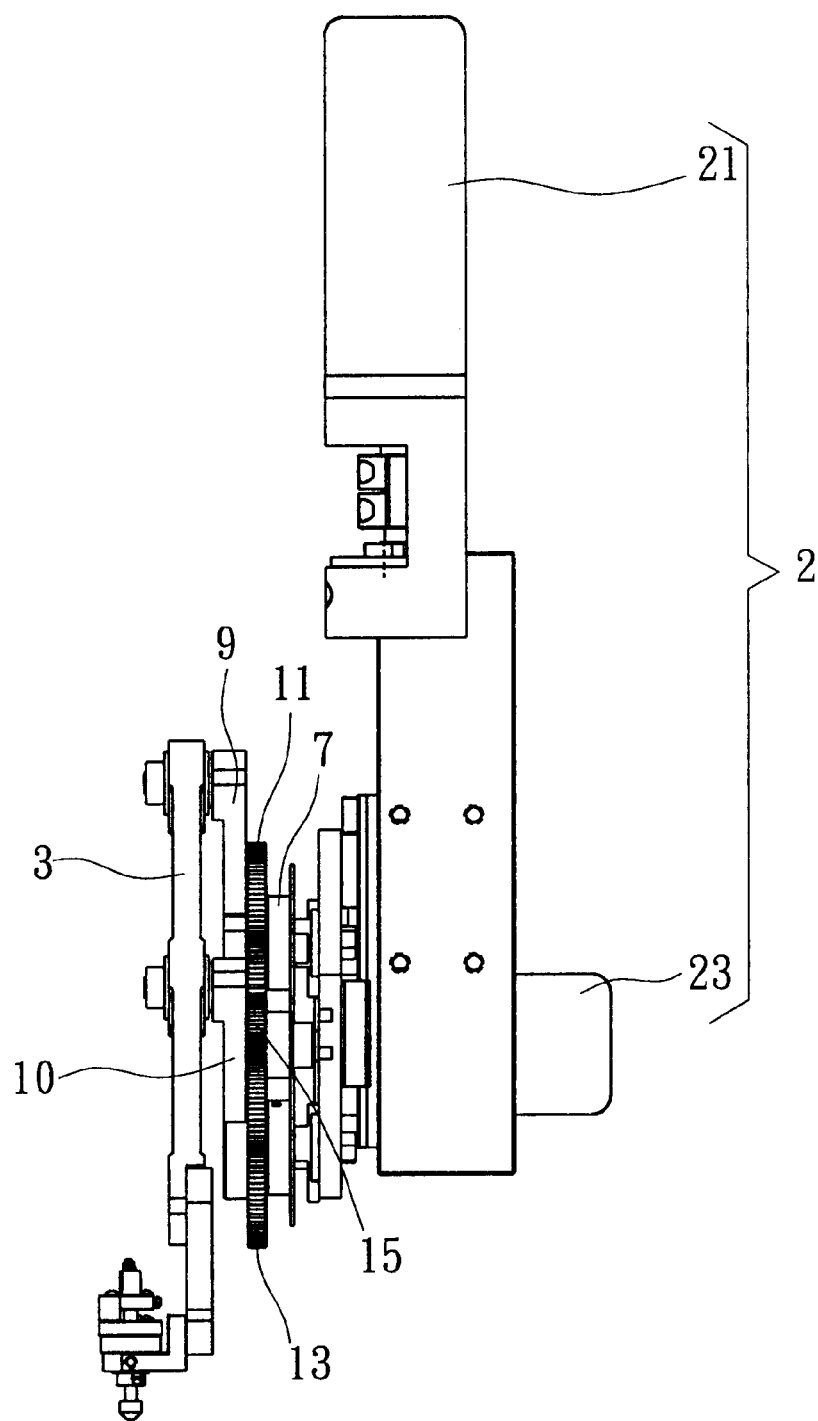
FIG. 2 is the side view drawing of the preferred embodiment of the invention.

Please refer to FIG. 1, which is the 3-dimensional drawing of the preferred embodiment of the invention. The preferred embodiment includes at least a gear set, which consists of at least a first big gear 11, a second big gear 13 and a small gear 15, wherein, the first big gear 11 and the second big gear 13 are the same diameter for same rotating speed; two driving devices 2, which consists of a first servo motor 21 and a second servo motor 23; a link mechanism 3, which one end is that a first pivot end 31 connects to the first big gear 11, and the connection is that a first coaxial link 9 pivots and fixes on the first big gear 11, thus the first coaxial link 9 rotates with the first big gear 11 simultaneously; another end of the first coaxial link 9 pivots on the first pivot end 31 of the link mechanism 3, and the end of the first coaxial link 9 is as a sheath covering around and not fixed on the first pivot end 31. Thus the link mechanism 3 is driven by the first big gear 11. The middle part of the link mechanism 3 is a second pivot end 33, which connects on the second big gear 13, and the connection is that a second coaxial link 10 pivots and fixes on the second big gear 13, thus the second coaxial link 10 rotates with the second big gear 13 simultaneously; another end of the second coaxial link 10 pivots on the second pivot end 33 of the link mechanism 3, and the end of the second coaxial link 10 is as a sheath covering around and not fixed on the second pivot end 33. Thus the link mechanism 3 is driven by the second big gear 12. The small gear 15 is in between the two big gears and connects to the two big gears separately. The arrangement for the two big gears and the small gear is that the centers of the three gears are arranged as an imagine line 8. After the connection of link mechanism 3 and gear set 1, the link mechanism 3 is parallel to the imagine line 8 in space, and both of them are with an angle to level. Please refer to FIG. 2, which is the side view drawing of the preferred embodiment of the invention. The second servo motor 23 drives to rotate the two big gears, and it makes that an end of the link mechanism 3 moves back and forth, which means the end of the link mechanism 3, not connecting to the first big gear 11, can be driven back and forth. Link mechanism 3 fixes on a mold plate 5 with gear set 1. A lift mechanism 4 is driven by the first servomotor 21. Another words, the first servomotor 21 drives the lift mechanism 4 via a driving link device 6 for lift mechanism 4 moving up and down. The lift mechanism 4 drives the mold plate 5 via a driven link device 7. As a result, link mechanism 3 and gear set 1 move up and down together.

Figure 3:
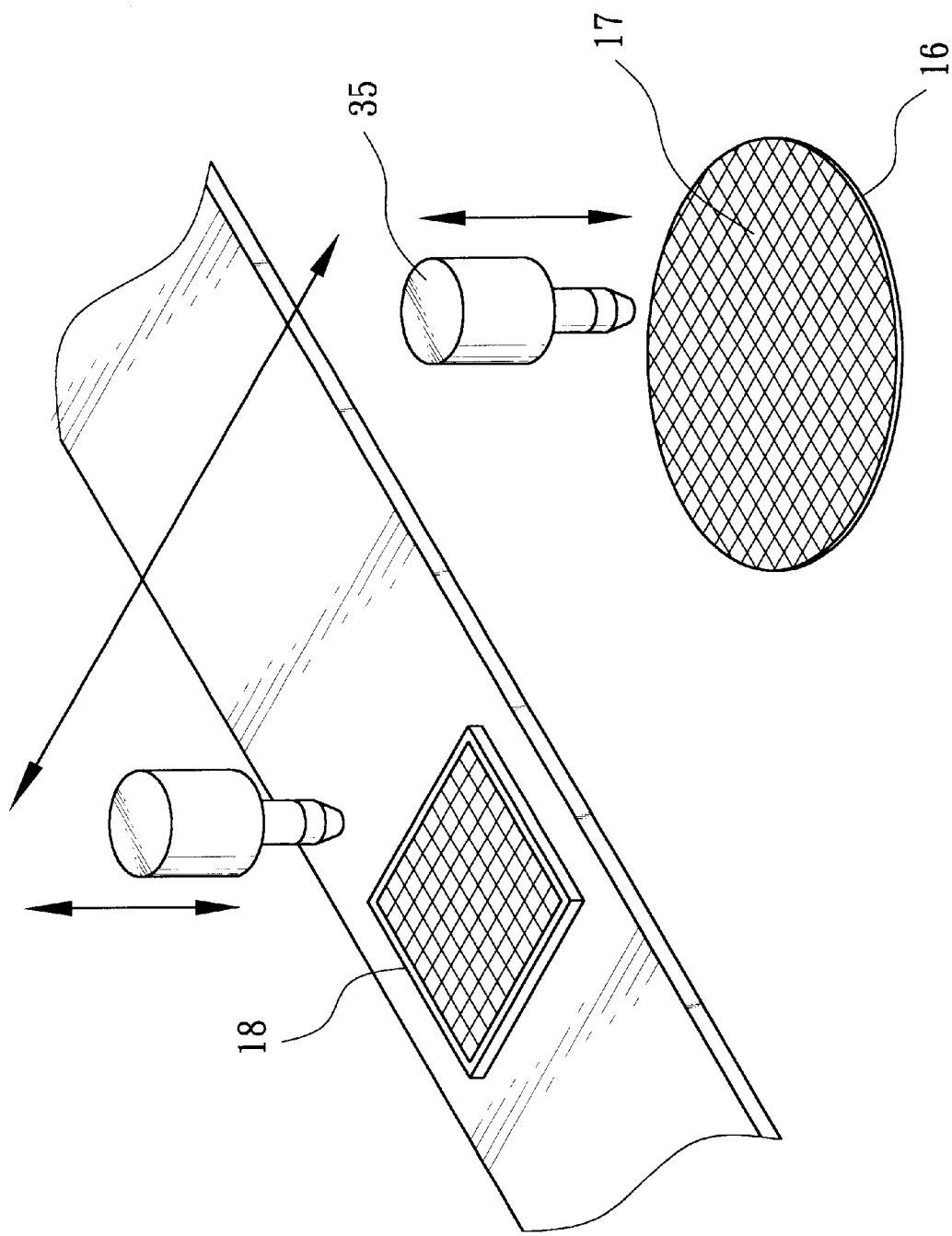
FIG. 3 is the application drawing of the preferred embodiment of the invention.

By the cooperation of aforesaid parts, the link mechanism 3 moves forth toward a non-horizontal direction and back toward the reverse direction, and moves down toward a non-vertical direction and up toward the reverse direction as well. The above moving actions include total four steps. Please refer to FIG. 3, which is the application drawing of the preferred embodiment of the invention. There is a vacuum absorber 35 installed on the reverse end of the first pivot end 31 of the link mechanism 3, and the vacuum absorber 35 connects to a vacuum device (not shown in figure) to absorb a single chip 17 on a wafer 16. Thus, the chip 17 is then moved to a chip receptacle 18.

Honestly, the invention utilizes simple mechanical structure to cooperate with electronic and vacuum systems to fast approach the goal which the complicate mechanism and electronic parts in prior art just can be done. However, all of the factors as space, time, cost, etc. are further improved by the invention.

It may thus be seen that the objects of the present invention set forth herein, as well as those made apparent from the foregoing description, are efficiently attained. While the preferred embodiments of the invention have been set forth for purpose of disclosure, modifications of the disclosed embodiment of the invention as well as other embodiment thereof may occur to those skilled in the art. Accordingly, the appended claims are intended to cover all embodiments that do not depart from the spirit and scope of the invention.

What is claimed is:

1. A device for fast taking out and putting in, which includes:
    a gear set, which consists of at least a first big gear, a second big gear and a small gear;
    at least two driving devices, which consists of a first driving device and a second driving device;
    a link mechanism, which one end connects to the first big gear, and middle part of the link mechanism connects to the second big gear, a small gear is in between the two big gears and connects to the two big gears separately, the arrangement for the two big gears and the small gear is that the centers of the three gears are arranged in and imaginary line, after the connection of link mechanism and gear set, the link mechanism is parallel to the imaginary line in space, and both of them are with an angle to level; the second driving device drives the two big gears to rotate for moving another end of the link mechanism back and forth, the link mechanism fixes on a mold plate with the gear set; and
    a lift mechanism, which is driven by the first driving device to move up and down, and then drives the mold plate for moving link mechanism and gear set up and down together.

2. The device for fast taking out and putting in as cited in claim 1, wherein, the two diameters of the first big gear and the second big gear are same.

3. The device for fast taking out and putting in as cited in claim 1, wherein, the two driving devices are two servo motors.

4. The device for fast taking out and putting in as cited in claim 1, wherein, one end of the link mechanism and a first coaxial link pivot and fix on the first big gear.

5. The device for fast taking out and putting in as cited in claim 4, wherein, the first coaxial link rotates with the first big gear simultaneously.

6. The device for fast taking out and putting in as cited in claim 1, wherein, middle part of the link mechanism and a second coaxial link pivot and fix on the second big gear.

7. The device for fast taking out and putting in as cited in claim 6, wherein, the second coaxial link rotates with the second big gear simultaneously.

8. The device for fast taking out and putting in as cited in claim 1, wherein, the first driving device drives the lift mechanism via at least a driving link device.

9. The device for fast taking out and putting in as cited in claim 8, wherein, the lift mechanism drives mold plate via at least a driven link device.

* * * * *